US005726596A

United States Patent [19]
Perez

[11] Patent Number: 5,726,596
[45] Date of Patent: Mar. 10, 1998

[54] HIGH-PERFORMANCE, LOW-SKEW CLOCKING SCHEME FOR SINGLE-PHASE, HIGH-FREQUENCY GLOBAL VLSI PROCESSOR

[75] Inventor: Paul L. Perez, Fort Collins, Colo.

[73] Assignee: Hewlett-Packard Company, Palo Alto, Calif.

[21] Appl. No.: 609,592

[22] Filed: Mar. 1, 1996

[51] Int. Cl.$^6$ .................................................. H03K 5/13
[52] U.S. Cl. .......................... 327/292; 327/293; 327/141; 327/258; 327/259
[58] Field of Search ........................ 327/141, 144, 327/291, 292, 293, 295, 294, 238, 239, 254–258, 259

[56] References Cited

U.S. PATENT DOCUMENTS

| | | | |
|---|---|---|---|
| 4,338,677 | 7/1982 | Morrill, Jr. et al. | 364/900 |
| 4,816,700 | 3/1989 | Imel | 327/239 |
| 5,057,701 | 10/1991 | Miller, Jr. | 327/292 |
| 5,122,679 | 6/1992 | Ishii et al. | 327/292 |
| 5,124,572 | 6/1992 | Mason et al. | 327/145 |
| 5,148,052 | 9/1992 | Yellamilli | 327/212 |
| 5,164,619 | 11/1992 | Luebs | 327/297 |
| 5,239,215 | 8/1993 | Yamaguchi | 327/292 |
| 5,257,214 | 10/1993 | Mason et al. | 364/736.5 |
| 5,289,403 | 2/1994 | Yetter | 327/141 |
| 5,299,158 | 3/1994 | Mason et al. | 365/189.04 |
| 5,306,962 | 4/1994 | Lamb | 327/259 |
| 5,317,204 | 5/1994 | Yetter et al. | 326/21 |
| 5,329,176 | 7/1994 | Miller, Jr. et al. | 326/21 |
| 5,376,842 | 12/1994 | Honoa et al. | 327/292 |
| 5,434,520 | 7/1995 | Yetter et al. | 326/93 |

*Primary Examiner*—Timothy P. Callahan
*Assistant Examiner*—T. T. Lam

[57] ABSTRACT

A single-phase clocking scheme for use in a VLSI chip having a plurality of localized logic blocks implemented thereon is presented. The present invention includes a first level global clock buffer for receiving an external global clock and producing a first level global clock. A plurality of second level clock buffers, one corresponding to each localized logic block, receive the first level global clock via protected equal length lines, and each produce a respective second level global clock. Each of the localized logic blocks include a plurality of third level clock buffers, wherein each third level clock buffer receives the second level global clock of its respective localized logic block, and each produces a third level local clock. The third level local clock buffers within each localized logic block generate different clocking schemes from each of the other third level local clock buffers contained within the same localized block. The present invention provides improved performance of global transfers of data between localized logic blocks located on far ends of the chip because the falling edges of the third level overlapping and non-overlapping clock signals CK1, CK1N and CK2, CK2N are coincident to each other.

17 Claims, 10 Drawing Sheets

FIG. 5 (a) CK1
FIG. 5 (b) CK2
FIG. 5 (c) CK1N
FIG. 5 (d) CK2N
"DEADTIME"

HIGH-PERFORMANCE, LOW-SKEW CLOCKING SCHEME FOR SINGLE-PHASE, HIGH-FREQUENCY GLOBAL VLSI PROCESSOR

FIELD OF THE INVENTION

The present invention relates generally to clocking schemes used in VLSI processors, and, more particularly, to a high-performance, low-skew single-phase clocking scheme with particular suitability to high-frequency global data transfers in a single VLSI chip.

BACKGROUND OF THE INVENTION

All microprocessors require the use of a clocking scheme in order to perform operations, including executing instructions and transferring data. In the early microprocessors, a single clock was used, typically having a 50% duty cycle. Only a single operation could be performed during any clock enable phase. As higher clock frequencies became not only desirable, but required, various schemes were employed to increase the allowable frequency of the clock cycle, as for example, by altering the duty cycle to increase the enable phase and decrease the disable phase while maintaining the smallest allowable clock cycle period. The clear problem with this method was that the maximum allowable clock frequency was limited to the setup and hold time requirements of the physical components. Other methods were needed to allow for increased clock frequency.

One method for handling greater clock frequencies is a method known as "pipelining". In this method, a dual-phase clocking scheme is used, which is generally implemented using a pair of differential symmetric clocks generated by a centralized clocking circuit. In the simple pipeline scheme, logic for implementing operations are divided into pipeline stages, whereby each stage represents one clock cycle. Alternating stages receive the differential clock signals, CK1 and CK2. Thus, while a given pipeline stage performs an operation during its CK1 enable phase, the immediately subsequent pipeline stage, which depends on the output of the given pipeline stage, waits during its CK2 disable cycle. Then, when CK1 enters the disable cycle, CK2 enters the enable cycle, and the immediately subsequent pipeline stage performs an operation.

Unfortunately, since typical pipelined data processing systems generally use global clocks, the skew and the rise/fall times of the clocking signals received by the respective pipelined circuits are poorly controlled. Uncontrollable skew is introduced by the different logic blocks. Since logic blocks perform different functions, most logic blocks in a microprocessor are implemented with differing logic structure. Thus, during operation, the logic path taken in any given logic block is unpredictable. Differing capacitance and resistive loads caused by the various logic paths taken result in clock skew. In other words, the differences in logic blocks make it nearly impossible to match the rising and falling edges of CK1 and CK2.

In addition to varying R-C loads, variation in the fabrication process across a given chip introduces process-dependent parameter variations in the circuit components, which also results in increased clock skew.

Thus, if the skew is large, slow clock signal fall times result which, for fast circuit, causes errors in the pipeline. Such errors are herein referred to as clock signal races and are characterized by pipeline situations in which data in one stage "sneaks" through to a subsequent stage before the proper clocking signal is received. As known to those skilled in the art, lost clock edges as a result of signal skew may lead to such errors.

A solution to the uncontrollable skew of the above dual-phase clocking scheme was presented in U.S. Pat. No. 5,124,572 to Mason. The prior art solution provided a clocking methodology for VLSI chips which uses global overlapping clocks plus locally or remotely generated non-overlapping clocks. Two overlapping clocks and two non-overlapping clocks are thus available in each block of a chip for use as timing edges. Non-overlapping clock signals are typically differential clock signals in which one clock signal has a rising edge which occurs after a falling edge of the other clock signal and a falling edge which occurs before a rising edge of the other clock signal. Such signals prevent clock signal races in a pipelined circuit by deactivating a subsequent stage before data is allowed to propagate through the current stage. The global overlapping clocks are used where possible to provide timing advantage. The non-overlapping clocks provide the advantage of introducing at a local level enough non-overlapping "deadtime" between clock edges to compensate for global level clock skew. This scheme thus allowed for the prevention of race conditions between storage elements.

However, prior art non-overlapping clocking schemes are problematic. The non-overlapping clocks are generated using feedback to generate the actual deadtime. The length of deadtime is a function of the number of gate delays contained in the feedback. The problem with feedback dependency is that is scales poorly with frequency. In other words, the deadtime length is independent of frequency and remains the same regardless of the frequency of the clock. Thus, the percentage of the phase allotted to deadtime increases as the frequency of the clock increases, resulting in a smaller percentage of the enable phase to perform the actual operations.

Another problem with the non-overlapping clocking scheme is that the non-overlapping clocks CK1N and CK2N always toggled. In CMOS technology, power is a function of the frequency of changes in voltage and capacitance. Thus, the continuous toggling of the non-overlapping clocks results in poor power performance specifications.

In addition, non-overlapping clock circuits had to be used in pairs regardless of which of the two global phases was to be deraced.

Another disadvantage of the non-overlapping two-phase clocking scheme was that it did not provide qualification to generate conditional pulses. One prior art solution, U.S. Pat. No. 5,306,962 to Lamb, added qualification to the non-overlapping clock generator to provide control lines with non-overlapping clock timing. However, this solution still suffers from the same disadvantages mentioned above with respect to the non-overlapping clock scheme.

Global overlapping clocks generally provide timing advantages with respect to non-overlapping clocks in that there is no dead time between a falling edge of one clock signal and the rising edge of the other clock signal. As a result, early clock edges may be received which allow improved system performance of the pipelined circuits. Global overlapping clocks are also generally easier to distribute to the circuitry without closely controlling the clock skew caused by time/phase shifts. However, as just noted, if the clock skew is large, race conditions may be created which may cause information to be lost when only global overlapping clocks are used for clocking the pipelined circuits.

Accordingly, it is desired to provide a low-skew clocking system for global data transfers across a single VLSI chip which provides the performance advantages of overlapping clocks for global transfers while allowing the safer non-overlapping local clocks to be used locally, and which also scales well with frequency and consumes less power.

SUMMARY OF THE PRESENT INVENTION

Therefore, in accordance with the present invention, there is provided a single-phase clocking scheme for use in a VLSI chip having a plurality of localized logic blocks implemented thereon. The VLSI chip includes a first level global clock buffer for receiving an external global clock and producing a first level global clock. A plurality of second level clock buffers, one corresponding to each localized logic block, each receive the first level global clock and each produce a respective second level global clock. Each of the localized logic blocks include a plurality of third level clock buffers, wherein each third level clock buffer receives the second level global clock of its respective localized logic block, and each produces a third level local clock. The third level local clock buffers within each localized logic block generate different clocking schemes from each of the other third level local clock buffers contained within the same localized block. In the preferred embodiment, a single clock signal is input to the first level global clock buffer, which is located at the center of the VLSI chip. The lines connecting the global clock input and the respective second level clock inputs are ideally of equal length and arranged symmetrically to minimize skew of the signal reaching the second level clock buffers.

The above arrangement provides tight control of the first level global clock to the localized logic blocks via their respective second level clock buffers. The equal length lines ensure that each localized block receives synchronous clock edges. Because a single external global clock is used, the phase scales in proportion to frequency as desired. Within each localized logic block, the number of third level clock buffers may be implemented as required, depending upon the logic within the localized logic block. Double-phase overlapping and non-overlapping clocks (i.e., CK1, CK2, CK1N, CK2N) may be implemented in up to four third level clock buffers to provide different clock signals within each localized logic block as needed. Thus, overlapping clocks CK1, CK2 may be used within each localized logic block for time-critical logic, and non-overlapping clocks CK1N, CK2N may be used where race conditions must be prevented. Skew introduced in the third level clock signals within each localized logic block, however, is eliminated in global transfers of data between localized logic blocks located on far ends of the chip, because the falling edges of the third level overlapping and non-overlapping clock signals CK1, CK1N and CK2, CK2N are coincident to each other.

The advantages realized by the present invention are many. The clock drive strength may be more efficiently tuned to local block loads for better skew control and edge-rate uniformity. Each local clock signal phase (CK1, CK2, CK1N, CK2N) is generated by an independent third level clock buffer circuit without being paired with other circuits, resulting in less required chip area. Also, each third-level buffer circuit can be qualified to generate conditional pulses, including register set, register dump, global driver control lines, pre-charge clock lines, power-down and test mode feature lines. Furthermore, isolation of the global clocks from random local block routes improves the RC component of the global clock throughout the chip. Global transfers between blocks can be timed to local clocks but still have a full clock phase for data transit. Globally transferred data can be received with local non-overlapping clocks to avoid RC-dependent races.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE INVENTION

The drawings, in general, depict a high-performance, low-skew single-phase clocking scheme with particular suitability to high-frequency global data transfers in a single VLSI chip. In particular, there is shown a single-phase clocking scheme for use in a VLSI chip having a plurality of localized logic blocks implemented thereon, which includes a first level global clock input for receiving an external global clock and producing a first level global clock, a plurality of second level clock inputs, and a plurality of third level clock buffers. The second level clock buffers, each corresponding to a localized logic block, each receive the first level global clock and produce a respective second level global clock. A plurality of third level clock buffer may reside within each of the localized logic blocks, wherein each receives the second level global clock of its respective localized logic block and each produces a third level local clock to drive the respective localized logic components of its respected localized logic block. Each third level clock buffer generates one of four possible signals: an overlapping clock signal CK1, CK2, or a non-overlapping clock signal CK1N, CK2N. Clock signals CK1 and CK1N have coincident falling edges, and clock signals CK2 and CK2N have coincident falling edges. Because each third level clock buffer is implemented identically in structure, all localized third level clock signals experience the same relative phase delay. Thus, the falling edges of like third level local clock signals maintain coincidence, thereby enabling low-skew global data transfers between localized logic blocks located on far ends of the chip to take place.

Figure 1:
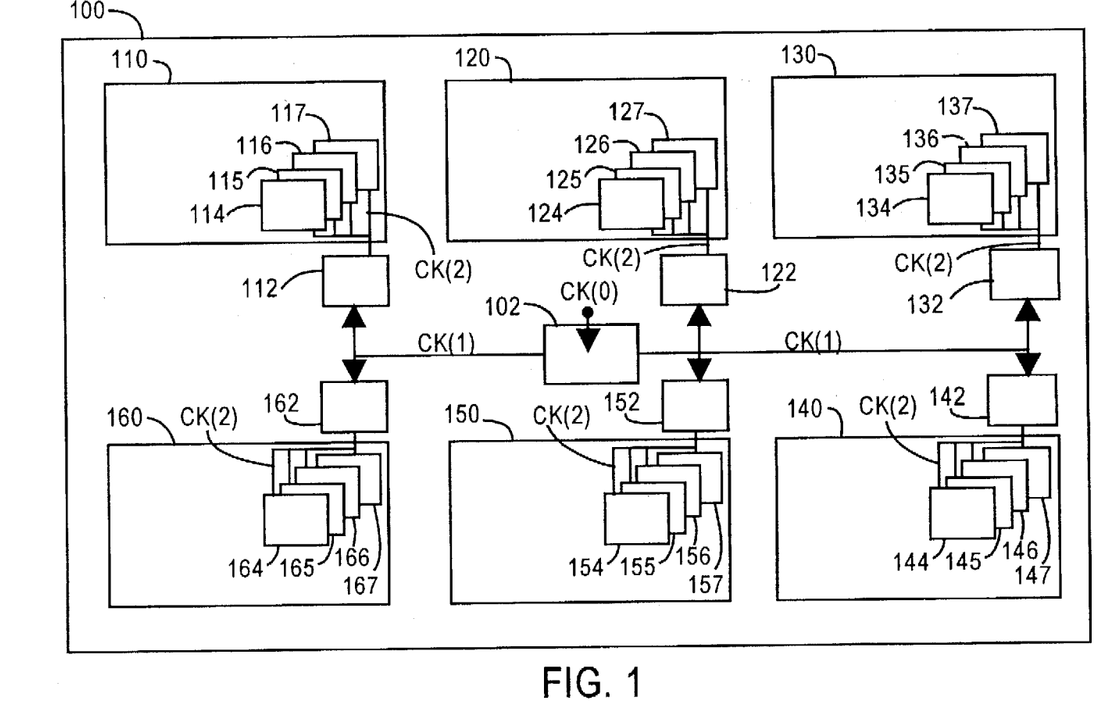
FIG. 1 shows a high-level block diagram of a VLSI chip containing localized logic blocks and embodying the present invention.

FIG. 1 depicts a high-level block diagram of a VLSI chip 100 with the single-phase clocking scheme of the present invention. As shown in FIG. 1, there is included a plurality of localized logic blocks 110, 120, 130, 140, 150, 160. A first level clock buffer 102 is located in the center of the VLSI chip 100. A plurality of second level clock buffers 112, 122, 132, 142, 152, 162, each corresponding to a localized logic block 110, 120, 130, 140, 150, 160, are arranged around, and preferably equidistant from and symmetrically about, the first level clock buffer 102. In the preferred embodiment, the routing scheme is shielded to prevent noise using power planes, and balanced by matching the routing lengths to each second level buffer. This provides tight control over the skew of the global clock signal distributed to each localized logic block 110, 120, 130, 140, 150, 160. The first level clock buffer 102 receives a single external global clock signal CK(0) and produces a first level clock signal CK(1) substantially in phase with (i.e., with minimized skew and delay from) the master clock CK(0). The first level clock signal CK(1) is gated in a synchronized manner to each of the second level clock buffers 112, 122, 132, 142, 152, 162. Each second level clock buffer 112, 122, 132, 142, 152, 162 is designed to receive the first level clock signal CK(1) simultaneously to each other second level clock buffer and to produce a second level clock signal CK(2) substantially in phase with the master clock signal CK(0).

Figure 2:
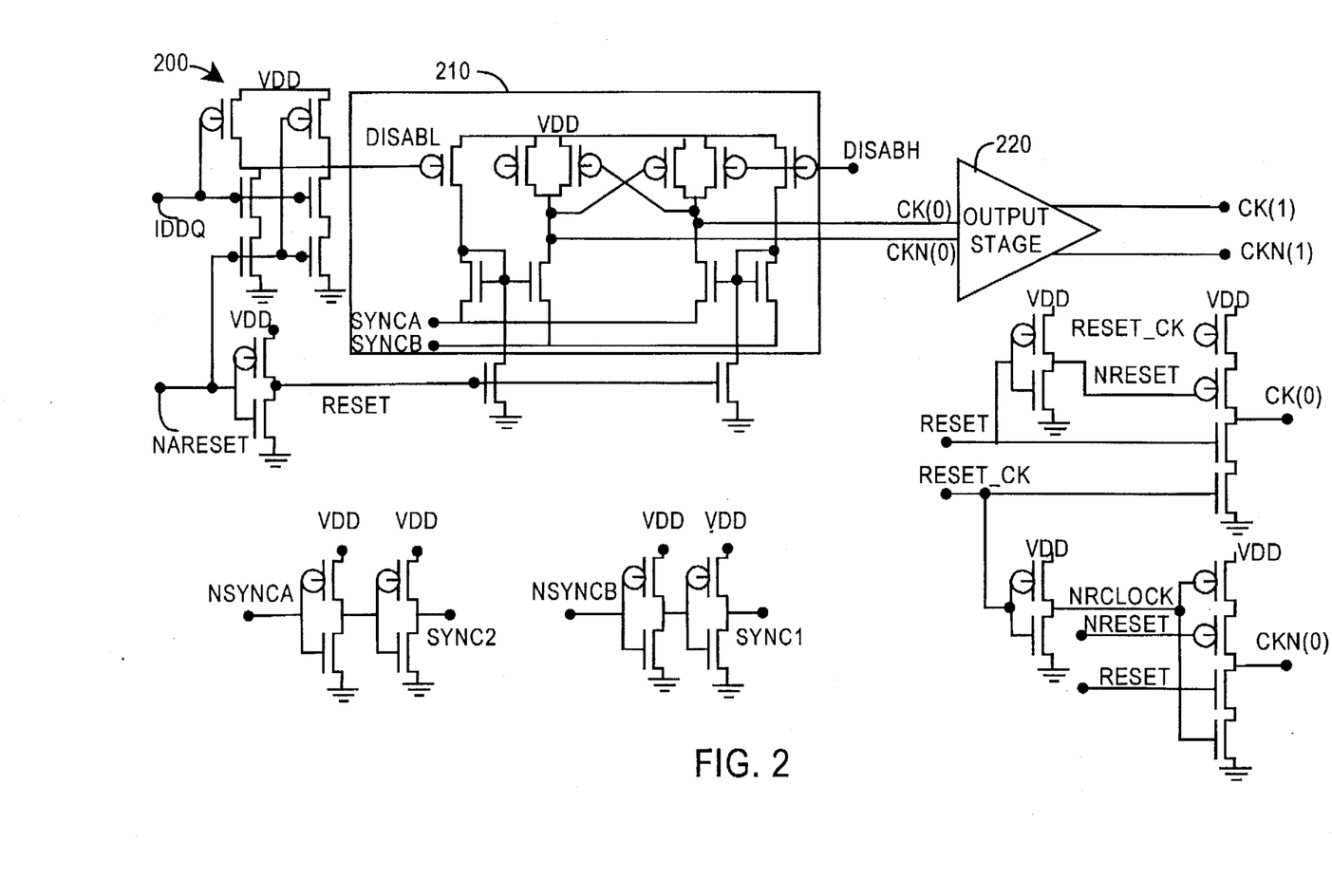
FIG. 2 is a schematic diagram of a preferred embodiment of a first level clock buffer used in the present invention.

FIG. 2 shows a schematic diagram of a preferred embodiment of the first level clock buffer. Synchronous buffering is known in the art, and thus it will be appreciated that any means for generating a highly-controlled single-phase signal with enough gain to drive the second level clock buffers may be used. As shown in FIG. 2, the preferred embodiment of the first level clock buffer, shown generally at 200, utilizes a technique for receiving a differential pair of the global clock signal CK(0), and triggering on the crossover point to generate a first level differential pair for the first level global clock signal CK(1). By triggering on the crossover point of a differential signal pair, the first level buffer produces a more consistent duty cycle because the crossover point occurs at the same time regardless of variations in the edge rates. In addition, the technique of triggering on the crossover point enhances signal integrity because the differential signal pair are self-coupled, by naturally compensating for overshoot and undershoot. Thus, as shown in FIG. 2, the first level clock buffer 200 comprises a conditioning block 210 which generates a conditioned differential master clock signal CK(0) and CKN(0) with enhanced noise and electrostatic discharge (ESD) immunity. The first level clock buffer 200 also comprises a synchronizer block 220 which receives the differential master clock signal CK(0) and synchronizes it to produce a highly-controlled synchronous differential first level clock signal CK(1), CKN(1).

Figure 3:
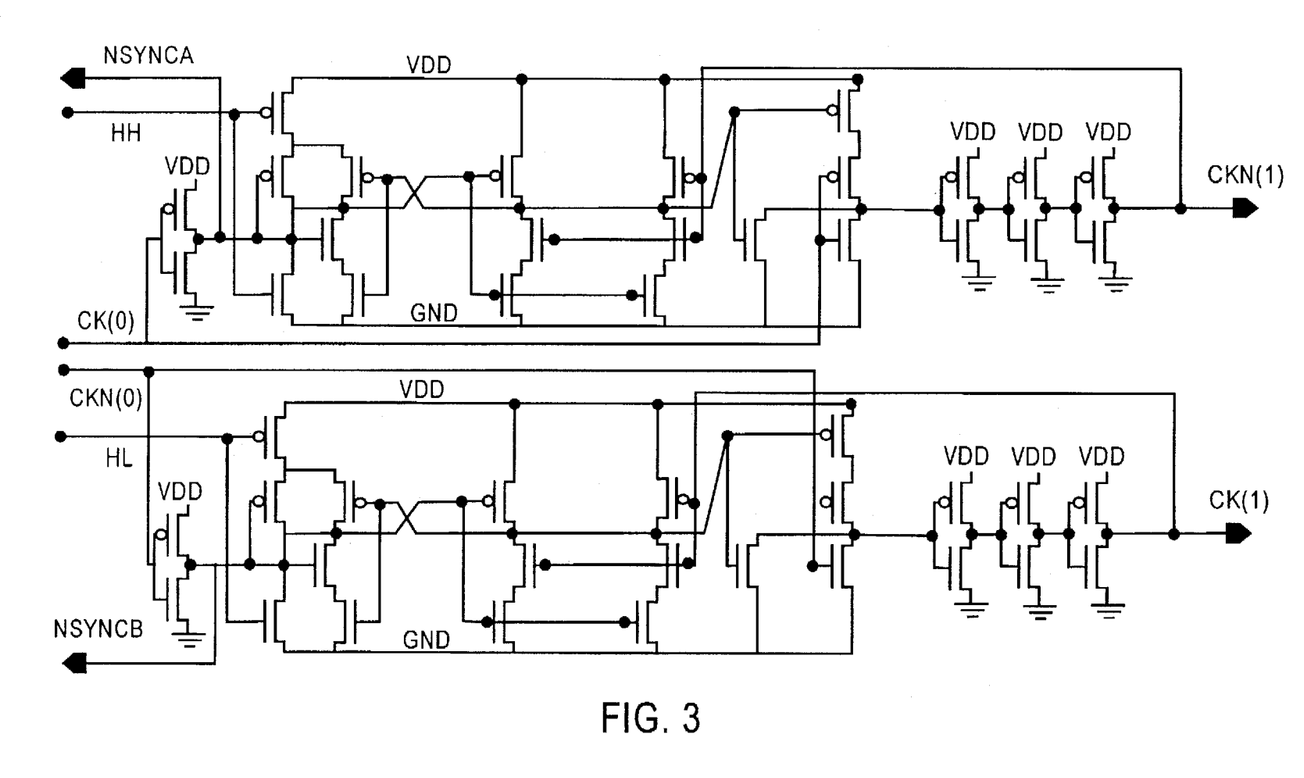
FIG. 3 is a detailed schematic diagram of a preferred embodiment synchronizer block used in the first level clock buffer of FIG. 2.

FIG. 3 shows a schematic diagram of a preferred embodiment of the synchronizer block 220 of the first level clock buffer shown in FIG. 2. As seen in FIG. 3, the preferred embodiment of the synchronizer block, shown generally at 300, receives the conditioned differential master clock signal CK(0), CKN(0). The crossover points of the differential master clock signal CK(0), CKN(0) are detected and used to generate a synchronized differential first level clock signal CK(1), CKN(1) for distribution to the second level buffer circuits.

Figure 4:
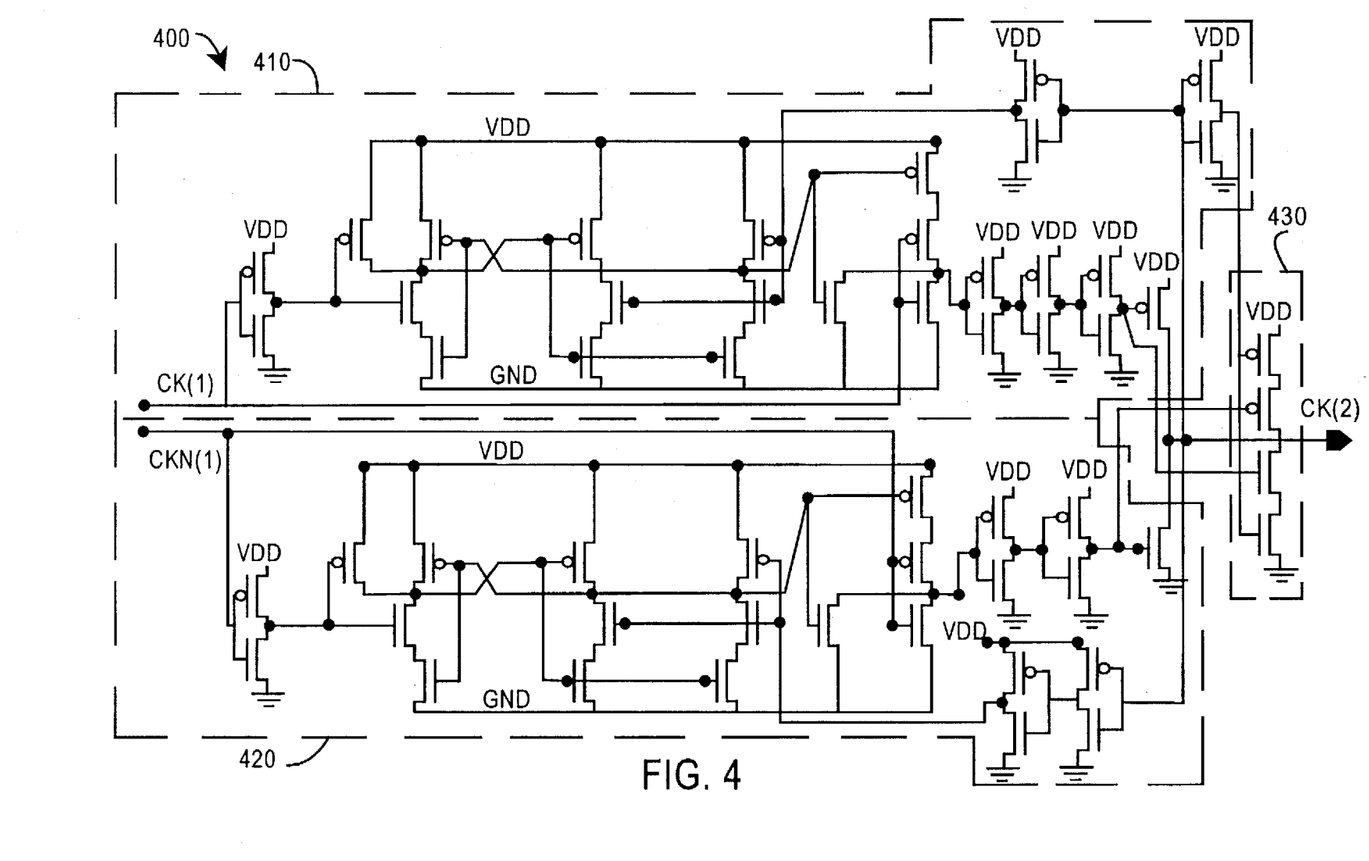
FIG. 4 is a schematic diagram of a preferred embodiment of a second level clock buffer used in the present invention.

FIG. 4 shows a schematic diagram of a preferred embodiment of a second level clock buffer in accordance with the present invention. As shown in FIG. 4, the preferred embodiment of the second level buffer, shown generally at 400, comprises a pair of synchronizer circuits 410, 420 and a push-pull circuit 430. Each synchronizer circuit 410, 420 receives a respective differential first level clock signal CK(1), CKN(1), detects the crossover point of the differential signal to control and minimize any skew introduced in the first level clock signal CK(1), CKN(1), and produces a synchronized differential intermediate signal C2HIGH, C2LOW. The push-pull circuit 430 receives the synchronized differential intermediate signals C2HIGH, C2LOW, eliminates any race conditions between the differential signal, and outputs a single-phase second level clock signal CK(2) for use by third level clock buffers.

The preferred embodiment implementations for the first and second level clock buffers shown in FIGS. 2-4 are by way of example only and are not intended to be limited to those shown. As will be appreciated by one skilled in the art, both the first and second level clock buffers may be implemented using any technique which generates tightly-controlled synchronous clock signals having the required drive capability to sustain its load.

Turning back to FIG. 1, each localized logic block 110, 120, 130, 140, 150, 160 includes at least one, and up to four, independent third level clock buffers 114-117, 124-127, 134-137, 144-147, 154-157, 164-167, located along the periphery of the block. Each third level clock buffer generates a third level local clock signal of a different type. The third level clock signals may include local non-overlapping clocks (CK1N, CK2N) for use in sequential logic and where signal deracing is required, and/or local overlapping clocks (CK1, CK2) for use in speed applications when signal defacing is not required. Although each localized logic block 110, 120, 130, 140, 150, 160 may contain different logic paths and load requirements, the third level clock buffers 114-117, 124-127, 134-137, 144-147, 154-157, 164-167, isolate the second level global clock signal CK(2) from random local block routes, thereby improving the RC component of the global clock signals CK(1), CK(2) throughout the chip. Further, although the third level buffers introduce delay between the global clock signals CK(1), CK(2) and the local clocks CK1, CK2, CK1N, CK2N, including skew in communication paths through the chip, the effect is minimized because each localized logic block 110, 120, 130, 140, 150, 160 uses identical independent third level buffer circuits and thus experience the same relative delay, in essence a forward time-shift of the clock domain. In other words, all local clocks (up to four in each logic block—CK1, CK2, CK1N, CK2N) track the global clock (CK) in terms of phase asymmetry. In addition, as discussed hereinafter, the extra skew introduced in the localized logic blocks is invisible outside the localized logic blocks because the falling edges of the third level clock signals CK1, CK1N and CK2, CK2N are synchronized with the global clock signals CK(1), CK(2) for global data transfers.

Figure 5:
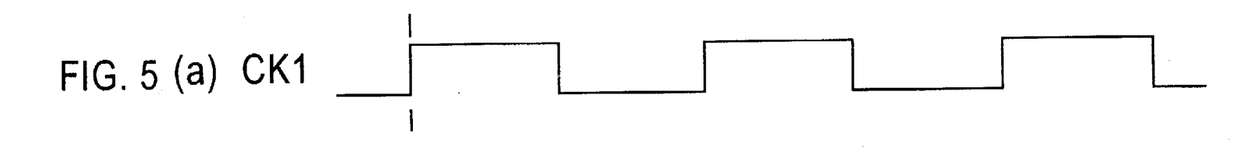
FIGS. 5(a)–(d) illustrate the timing relationships of two overlapping clocking signals (FIGS. 5(a) and 5(b)) and two non-overlapping clock signals (FIGS. 5(c) and 5(d)) generated by third level clock buffers.

FIGS. 5(a)–5(d) illustrate the timing relationships of the possible four local clock signals CK1, CK2, CK1N, and CK2N. As shown in FIGS. 5(a) and 5(b), CK1 and CK2 are differential overlapping clock signals. CK1 and CK2 are symmetrical, wherein the rising edges of CK1 are coincident to the falling edges of CK2 and the falling edges of CK1 are coincident to the rising edges of CK2. Thus, the rising and falling edges for CK1 and CK2 have equal delays from the second level global clock signal edge CK(2). CK1N and CK2N, on the other hand, are differential non-overlapping clock signals having a dead time between the time one clock falls and the other clock rises, as shown in FIGS. 5(c) and 5(d). The amount of dead time is bounded in the slow case by the total skew encountered in the clocks, and in the fast case by the minimum amount required to guarantee no races.

An important aspect of the present invention, as shown in FIGS. 5(a)-5(d), is that the falling edges of CK1 and CK1N are coincident, having equal delays from the received edges of the global second level clock signal CK(2). By symmetry, the falling edges of CK2 and CK2N are also coincident, having equal delays. The coincident falling edges of the overlapping and non-overlapping signals CK1, CK1N and CK2, CK2N allow synchronous global data transfers to take place between localized logic blocks located in opposite portions of the chip regardless of varying RC-component induced delay or local skew between the different third level clock signals of the transferring and receiving localized logic blocks. In other words, since each third level clock buffer circuit is identically implemented, receives the same tightly controlled synchronous global clock signal CK(2), and is load matched to its corresponding localized logic block, each third level clock buffer generates skew to the same relative degree as each other third level clock buffer on the integrated circuit. The synchronous falling edges of both overlapping and non-overlapping third level clock signals CK1, CK1N and CK2, CK2N of both the transferring and receiving localized logic blocks allow global transfers between localized logic blocks located in faraway portions of the chip to be timed to local clocks while still having a full clock phase in data transit. In addition, because the falling edges of the overlapping and non-overlapping clocks CK1, CK1N and CK2, CK2N are coincident, globally transferred data can be received with local non-overlapping clocks CK1N, CK2N to avoid RC-dependent races.

Figure 6:
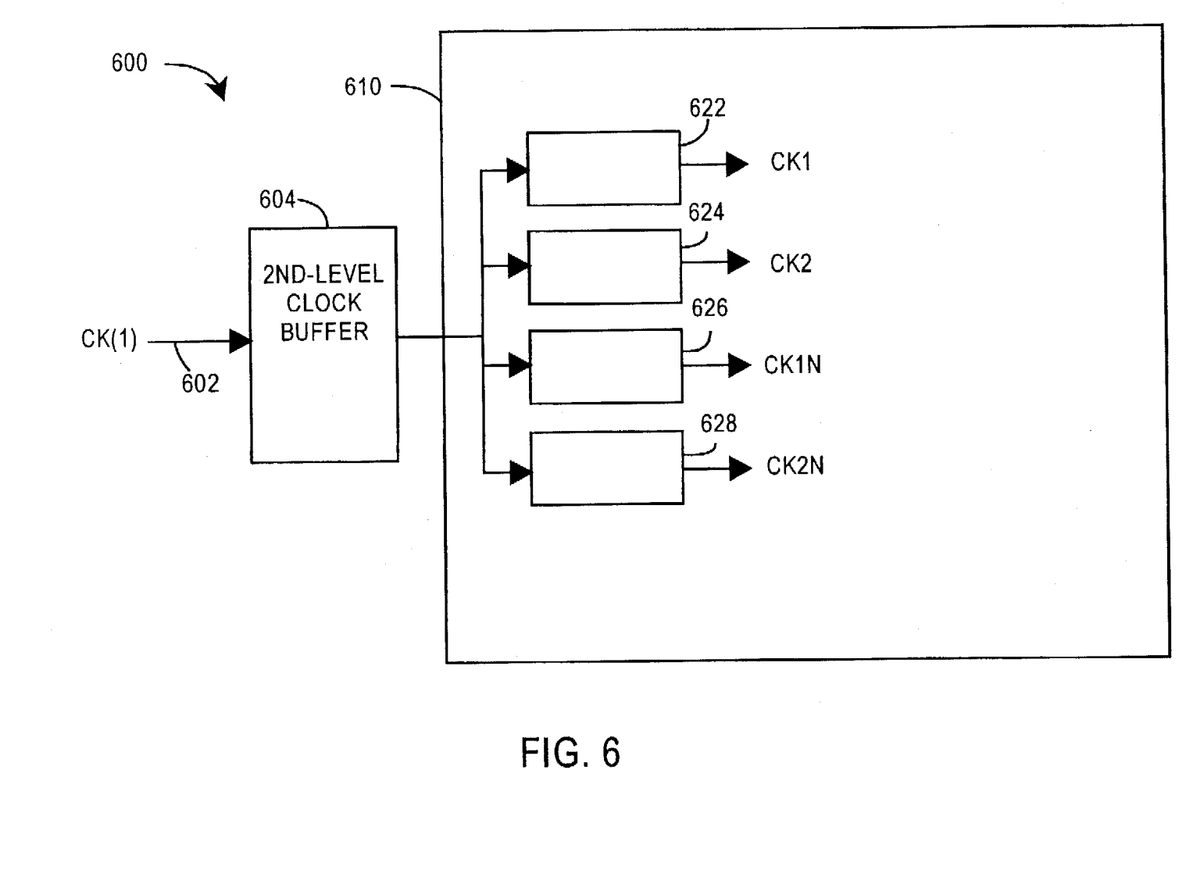
FIG. 6 illustrates a third level clock distribution system for a localized logic block which requires all four overlapping and non-overlapping clock signals.

FIG. 6 illustrates a third level clock distribution system 600 for a localized logic block 610 which requires all four possible clock signals CK1, CK2, CK1N and CK2N. As shown in FIG. 6, four independent third level clock buffer circuits 622-628 receive the second level clock signal CK(2) from a second level clock buffer 604 associated with the localized logic block 610. The four independent third level clock buffer circuits 622-628 generate the four respective clock signals CK1, CK2, CK1N, CK2N. Preferably, the second level clock buffer 604 and clock distribution network 606 are designed in such a manner that the distribution delays and skews are minimized.

Because each of the possible four clock signals CK1, CK2, CK1N, CK2N are generated with independent circuits, the number of third level clock buffers may be varied from 1 to 4 as required by the logical function implemented in the localized logic block 610. Thus, overlapping clocks CK1 and/or CK2 should be used where speed is important and race conditions are not a problem. Global transfers of data across the chip are initiated with the rising edges of CK1 and CK2 to allow the full clock phase to used for the transfer and thereby improving performance. Clock signals CK1N and/or CK2N should be used where race conditions are a problem. The ability to independently generate each clock signal CK1, CK2, CK1N, CK2N allows each third level clock buffer circuit to be implemented only if its clock signal is required. This conserves space by not requiring implementation of clock signal circuits which generate unnecessary clock signals.

Another aspect of the third level clock buffers 622-628 is that they may also be used as qualifier circuits to accept control signals and generate conditional pulses, for use in set/dump, "power-down", or "test-mode" features. Because a single third level clock buffer accepts both a clock signal and a qualifier signal, there is no difference in delay between qualified set/dump lines and locally generated clocks. The conditional pulse will have coincident falling edges to other like third level clock signals. The advantages realized by providing qualification for generating conditional pulses include reduced power consumption since the conditional pulses fire only when required, standardized de-racing circuits which eliminate design-dependent races, and reduced loading on the global clock signal CK.

Another important aspect of the third level clock buffer circuits 622-628 is their high capacitive gain. Each third level clock buffer 622-628 must be designed to drive a very large output capacitance relative to its input capacitance in order to minimize the skew of the local clock signals to allow for precise local clock control. In addition, since each localized logic block varies in terms of its load, third level clock buffers must be capacitively matched to the load impedance of its corresponding localized logic block in order to ensure that similar local clock signals in different localized logic blocks experience the same relative delay. Such is important for maintaining coincident edges in clock signals of like kind for global data o transfers. In the preferred embodiment, a third level clock buffer may be replicated and combined in parallel to drive a load heavier than that rated for a single third level clock buffer circuit. Parallel combination increases the driving capability of a third level clock buffer without affecting the delay time of its output signal. Furthermore, it is also contemplated that additional capacitors be used wherever possible to help balance loads.

Figure 7:
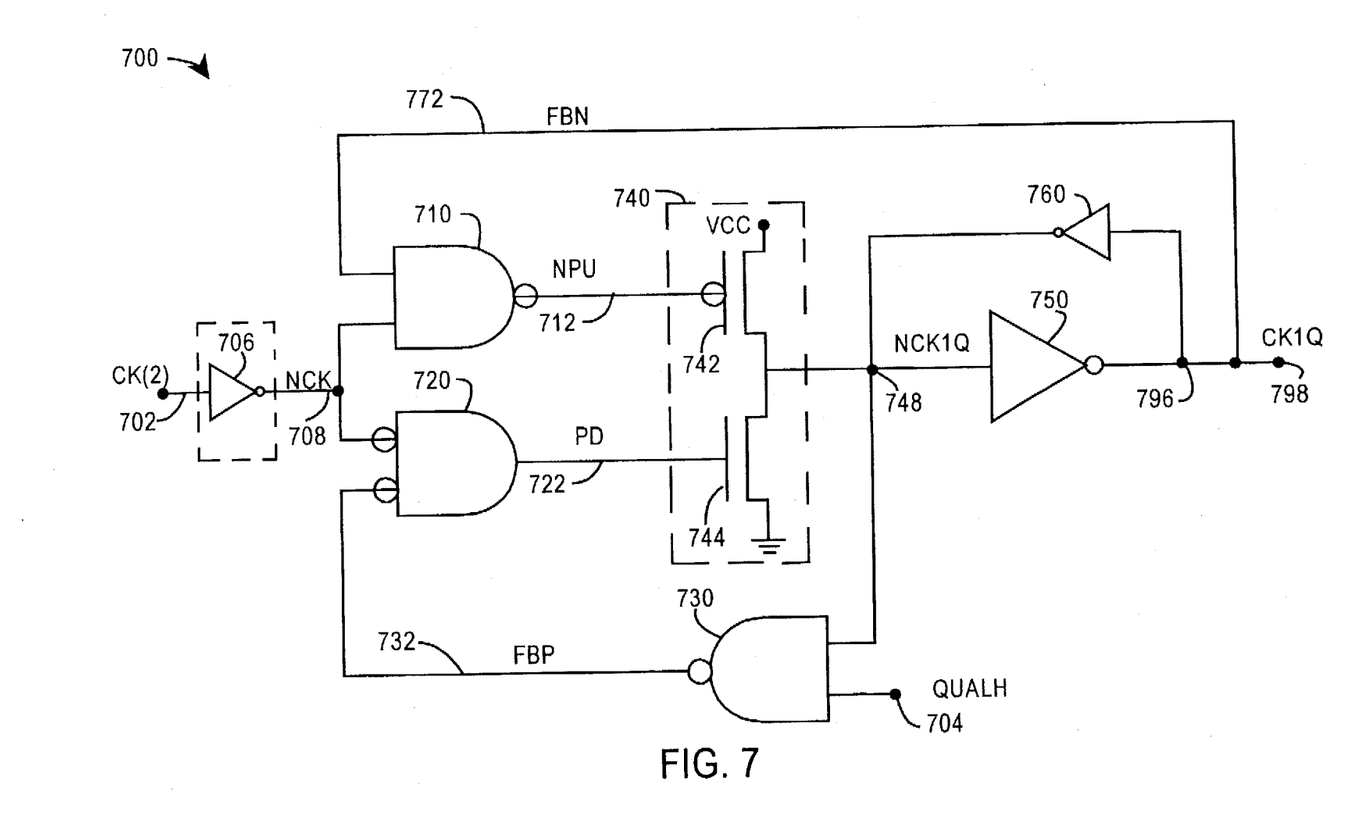
FIG. 7 is a logic diagram of a preferred embodiment of a third level clock buffer in accordance with the present invention.

FIG. 7 illustrates a preferred embodiment of a third level clock buffer, shown generally at 700. As shown in FIG. 7, the third level clock buffer 700 receives a second level clock signal CK(2) 702 as a first input. A first inverter 706 inverts the second level clock signal CK(2) to produce inverted second level clock signal NCK(2) 708. A first 2-input NAND gate 710 receives the inverted second level clock signal NCK(2) at a first input, and an inverted output signal NCK1Q at a second input. The first 2-input NAND gate 710 produces an inverted pullup signal NPU 712 at its output. As also shown in FIG. 7, the third level clock buffer 700 receives a qualifier signal QUALH 704 as a second input. A second 2-input NAND gate 704 receives the qualifier signal QUALH 704 at a first input, and the inverted output signal NCK1Q at a second input. The second 2-input NAND gate 730 produces a feedback signal FBP 732. A 2-input NOR gate receives the feedback signal FBP 732 at a first input, and the inverted second level clock signal NCK(2) 708 at a second input. The 2-input NOR gate 720 produces a pulldown signal PD 722 at its output.

The third level clock buffer 700 also comprises a pushpull circuit 740, comprising a push FET 742 coupled in drain-source relationship with a pull FET 744. The push FET 742 has a source coupled to a power supply VDD, a gate coupled to receive the inverted pullup signal NPU 712, and a drain coupled to both the source of the pull FET 744 and an inverted output node 748. The push FET 744 has a source coupled to both the drain of the push FET 742 and the inverted output node 748, a gate coupled to receive the pulldown signal PD 722, and a drain coupled to the chip ground. In the preferred embodiment, the push FET 742 is implemented using a PMOSFET and the pull FET 744 is implemented using an NMOSFET.

The third level clock buffer also comprises a second inverter 750 which is coupled to receive the inverted output signal NCK1Q 746 and to produce an output signal CK1Q 798. The second inverter 750 has a high gain and is matched to the specific capacitive load of its corresponding localized logic block. A third feedback inverter 760 is coupled between the output node 796 and the inverted output node 748. The third feedback inverter 760 improves noise immunity and prevents a floating condition from occurring on the inverted output signal NCK1A 746. Thus, the third feedback inverter 760 drives the inverted output node 748 whenever the inverted pullup signal NPU 712 is high and the pulldown signal PD 722 is low at the same time.

Generally, the third level clock buffer 700 operates as a 2-input AND gate, with the second level clock signal CK(2) and the qualifier signal QUALH as inputs, to produce a third level clock signal CK1Q reflecting the state of the inputs. Under normal operation, the qualifier signal QUALH is tied high, and the third level clock signal CK1Q is a delayed and self-timed version of the second level clock input CK(2). The phase of the third level clock signal CK1Q is determined by the FET sizes used to implement the third level clock buffer.

If the third level clock buffer is to be used to generate a conditional pulse, the qualifier signal QUALH will normally be low, causing the third level clock signal output 798 to be low regardless of the toggling of the second level clock signal CK(2) input. Then, if QUALH goes high, a conditional pulse is to be generated. When QUALH goes high, the third level clock signal output 798 follows the second level clock signal CK(2) input, resulting in a delayed version of the second level clock signal CK(2).

Figure 8:
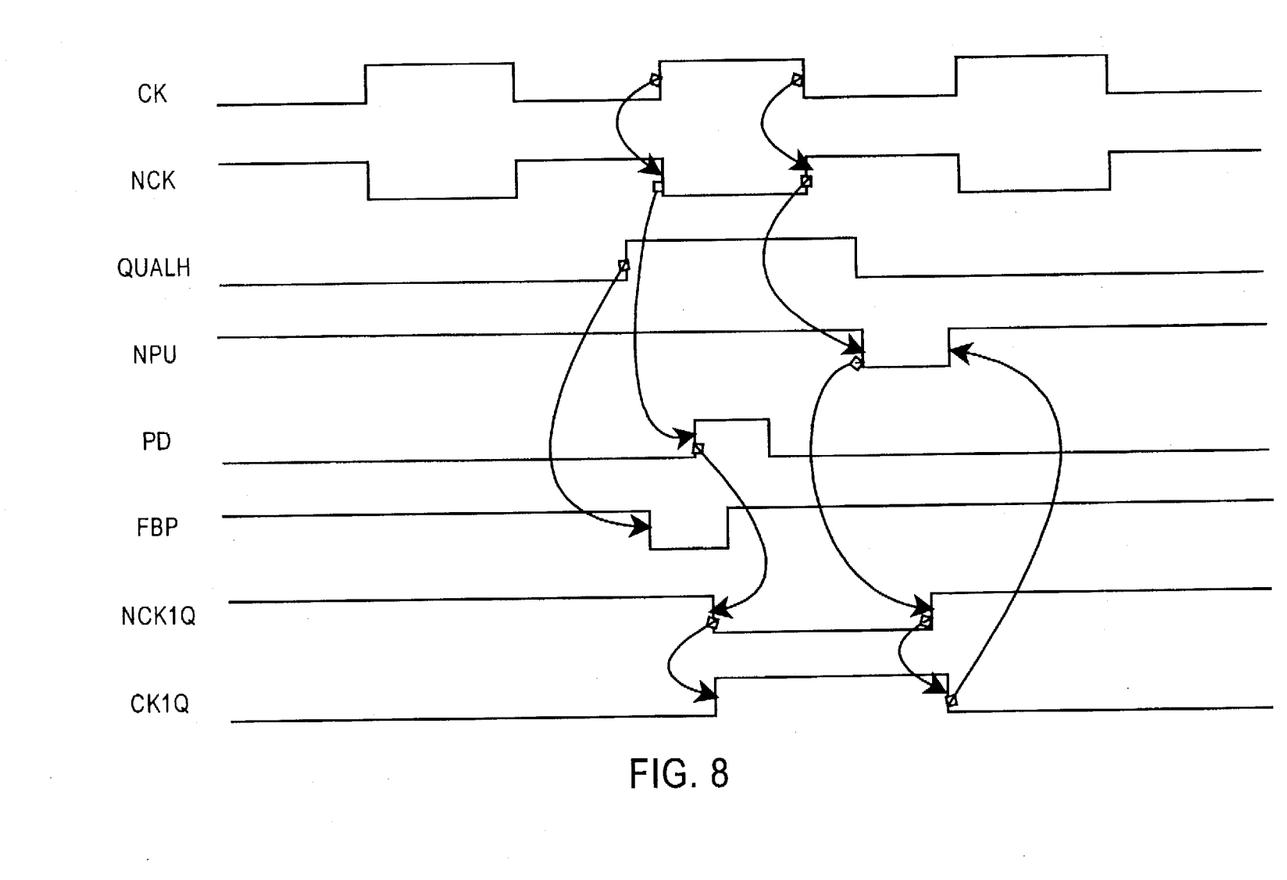
FIG. 8 illustrates the timing relationships of the third level buffer signals shown in FIG. 7 in various modes of operation.

FIG. 8 depicts a timing diagram using exemplary input signals CK(2) and QUALH to illustrate the various modes of operation of the third level clock buffer 700. With reference to FIGS. 7 and 8, the operation of the third level buffer used for qualification is as follows. Assuming that qualifier signal QUALH 704 is initially low, the feedback signal FBP 732 will be high, causing the pulldown signal 722 to be low, in turn causing the inverted output signal NCK1Q 746 to be high, and thus the third level clock output signal CK1Q 798 will be low regardless of toggling by the input second level clock signal CK(2) 702. The third feedback inverter keeps the pullup signal NPU 712 high.

The qualifier signal QUALH 704 may transition from low to high at any time, even coincidentally with the rising edge of the second level clock signal CK(2) 704 (i.e., with zero setup time). The low to high transition of QUALH 704 causes the feedback signal FBP 732 to transition from high to low. This conditions the 2-input NOR gate 720 to expect a high to low transition by the inverted second level clock signal NCK(2) 708. When the second level clock signal CK(2) 702 transitions from low to high, the inverted second level clock signal NCK(2) transitions from high to low, causing the pulldown signal PD 722 at the output of the 2-input NOR gate 720 to transition from low to high.

Once the pulldown signal PD 722 transitions from low to high, the qualifier signal QUALH 704 is free to "reset", or transition from high to low. The operation of the third level clock buffer is self-timed from this point because the delays in the third level clock buffer output signal 798 are controlled by the sized of the transistors in the circuit and the capacitive load present at the output node 796.

Thus, when the pulldown signal PD 722 transition from low to high, the NMOS pull transistor 744 turns on, pulling the inverted output signal NCK1Q 746 from high to low at inverted output node 748, and causing the third level clock buffer output signal CK1Q 798 to transition from low to high. The high to low transition by inverted output signal NCK1Q 746 also causes feedback signal FBP 732 to transition low to high, which in turn causes the pulldown signal to transition from high to low, thereby turning off the NMOS pull transistor 744. As this happens, inverted output signal NCK1Q 746 will be held low by third feedback invertor 760.

The third level clock buffer 700 remains in the above state (with CK1Q high) until the second level clock input CK(2) 702 makes a high to low transition. A high to low transition by the second level clock signal CK(2) 702 causes the inverted second level clock signal NCK(2) 708 to transition low to high, causing inverted pullup signal NPU 712 to transition high to low, thereby turning on the PMOS push transistor 742. The PMOS push transistor 742 pushes the inverted output signal NCK1Q 746 on inverted output node 748 from low to high, causing the third level clock buffer output signal CK1Q 798 to transition from high to low. The high to low transition by output signal CK1Q 798 causes the inverted pullup signal NPU 712 to transition from low to high, thereby turning off PMOS push transistor 742. Assuming QUALH 704 does not return to another high state, the third feedback invertor 760 holds inverted output signal NCK1Q high to maintain the third level clock buffer output signal CK1Q low.

When the third level clock buffer is to be used as a clocking circuit, the qualifier signal QUALH 704 is tied high to allow the output signal CK1Q 798 to follow the input second level clock signal CK(2) 702. As mentioned above, the FET sizes determine the delay time of the output signal CK1Q 798.

FIG. 7 shows a preferred embodiment of a third level clock buffer for generating an overlapping signal CK1 or a non-overlapping signal. A complementary overlapping signal CK2 or a complementary non-overlapping signal may be generated using the same circuit, but without the initial inverter 706.

Figure 9:
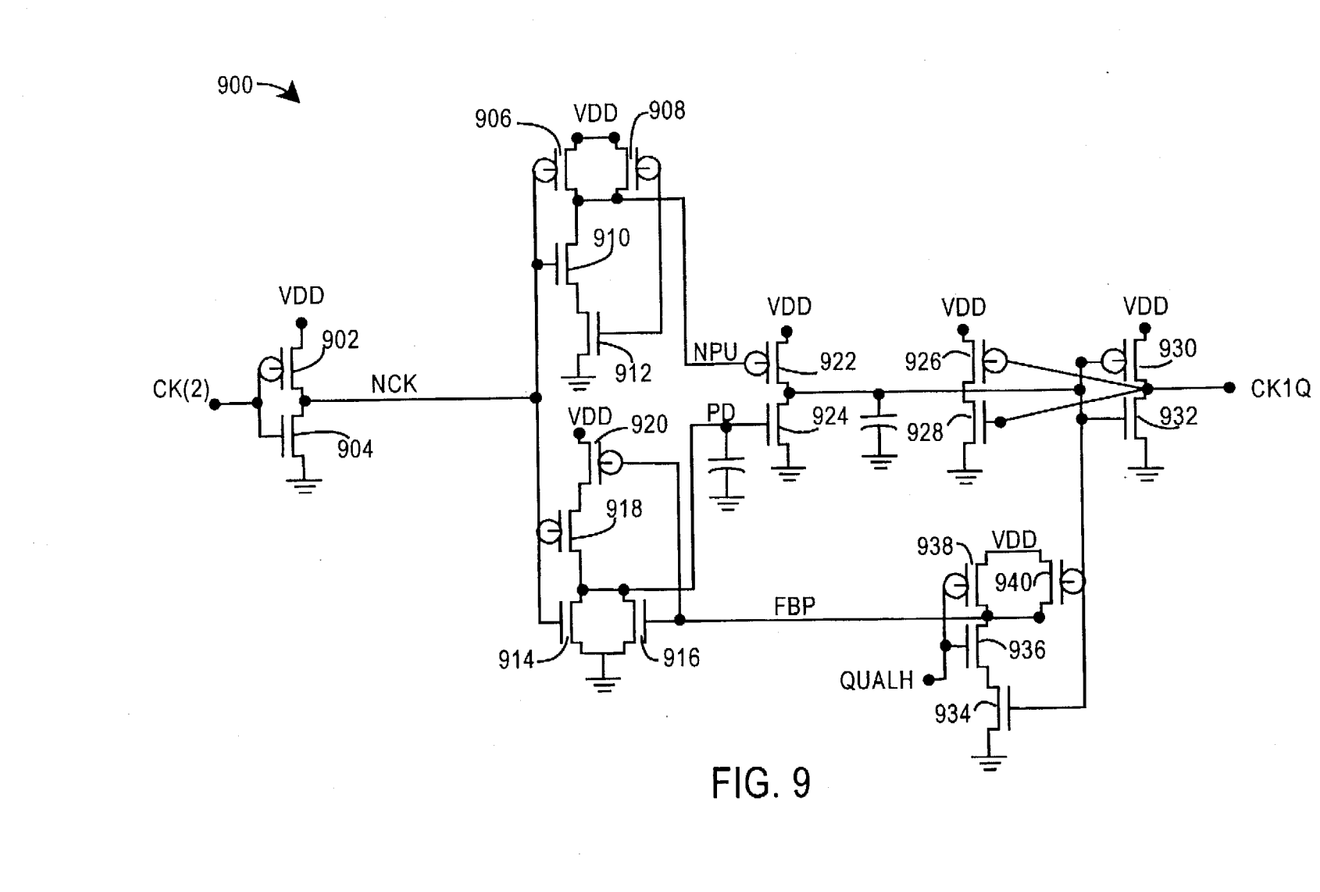
FIG. 9 is a detailed schematic of a preferred embodiment third level clock buffer for generating overlapping clock signal CK1 and non-overlapping clock signal CK1N.

FIG. 9 shows a detailed schematic of one preferred embodiment of a third level clock buffer circuit for generating overlapping clock signal CK1 or non-overlapping clock signal CK1N, shown generally at 900.

The FET sizing listed below in TABLE A is tuned to generate an overlapping clock signal CK1 from a 167 MHz global single-phase clock signal CK using slow FETS, and having a qualifier setup time of 25 psec with respect to the global single-phase clock signal CK. TABLE A specifies the FET sizing for each of the various FETS in the third level clock buffer of FIG. 9.

TABLE A

| FET | SIZE (width/length in microns) |
| --- | --- |
| 902 | 23.6/1 |
| 904 | 10.4/1 |
| 906 | 0.8/1 |
| 908 | 3.9/1 |
| 910 | 14.7/1 |
| 912 | 20/1 |
| 914 | 0.8/1 |
| 916 | 6/1 |
| 918 | 17/1 |
| 920 | 23/1 |
| 922 | 58/1 |
| 924 | 34/1 |
| 926 | 2/1 |
| 928 | 0.8/1 |
| 930 | 150/1 |
| 932 | 80/1 |
| 934 | 8/1 |
| 936 | 8/1 |

TABLE A-continued

| FET | SIZE (width/length in microns) |
|---|---|
| 938 | 14/1 |
| 940 | 2/1 |

Using the above FET sizing, the following measurements were taken:

CK rising to CK1 rising: 622 psec

CK falling to CK1 falling: 662 psec

CK rising to CK falling: 2.99 nsec

CK1 rising to CK1 falling: 2.97 nsec.

The above measurements illustrate a 99% hightime (rising edge to falling edge) retention and a minimized delay (134–291 psec) delay between like edges of the global single-phase clock and the universal qualified clock buffer output signal.

The FET sizing listed below in TABLE B is tuned to generate a non-overlapping clock signal CK1N from a 167 MHz single-phase clock signal, and having a qualifier setup time of −200 psec with respect to the global single-phase clock signal CK (meaning there is zero setup time). TABLE B specifies the FET sizing for each of the various FETS in the universal qualified clock buffer circuit of FIG. 9.

TABLE B

| FET | SIZE (width/length in microns) |
|---|---|
| 902 | 13/1 |
| 904 | 3.2/1 |
| 906 | 0.8/1 |
| 908 | 2/1 |
| 910 | 7/1 |
| 912 | 11/1 |
| 914 | 0.8/1 |
| 916 | 3/1 |
| 918 | 3.8/1 |
| 920 | 6.7/1 |
| 922 | 28/1 |
| 924 | 20/1 |
| 926 | 1/1 |
| 928 | 0.6/1 |
| 930 | 85/1 |
| 932 | 45/1 |
| 934 | 4/1 |
| 936 | 4/1 |
| 938 | 6.6/1 |
| 940 | 1.5/1 |

Figure 10:
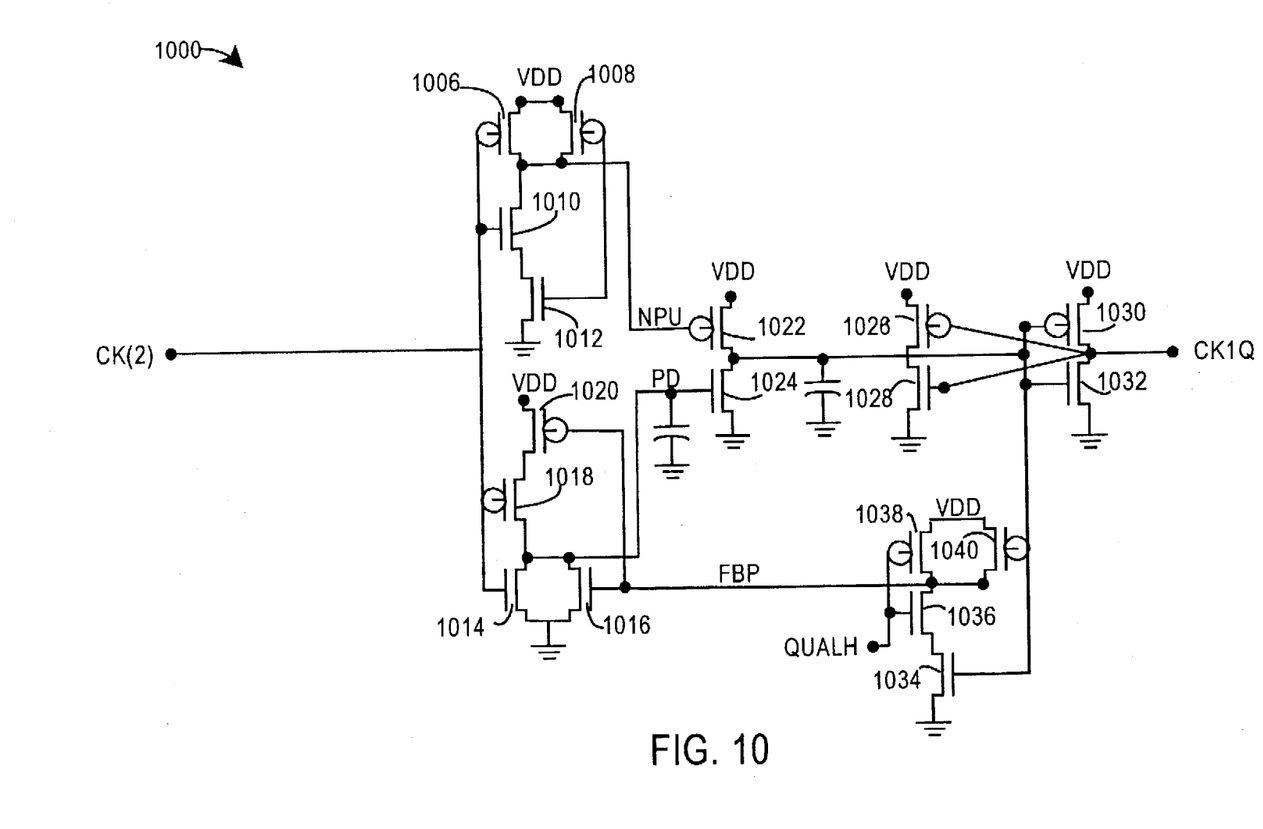
FIG. 10 is a detailed schematic of a preferred embodiment third level clock buffer for generating overlapping clock signal CK2 and non-overlapping clock signal CK2N.

FIG. 10 shows a detailed schematic of one preferred embodiment of a third level clock buffer circuit for generating overlapping clock signal CK2 and non-overlapping clock signal CK2N, shown generally at 1000.

The FET sizing listed below in TABLE C is tuned to generate an overlapping clock signal CK2 from a 167 MHz single-phase clock signal CK, and having a qualifier setup time of 25 psec with respect to the global single-phase clock signal CK. Table C specifies the FET sizing for each of the various FETS in the third level clock buffer of FIG. 10.

TABLE C

| FET | SIZE (width/length in microns) |
|---|---|
| 1006 | 2/1 |
| 1008 | 3.6/1 |
| 1010 | 8/1 |
| 1012 | 12.8/1 |
| 1014 | 2/1 |
| 1016 | 6/1 |
| 1018 | 14/1 |
| 1020 | 19/1 |
| 1022 | 48/1 |
| 1024 | 34/1 |
| 1026 | 2/1 |
| 1028 | 0.8/1 |
| 1030 | 150/1 |
| 1032 | 80/1 |
| 1034 | 8/1 |
| 1036 | 8/1 |
| 1038 | 14/1 |
| 1040 | 2/1 |

Using the above FET sizing, the following measurements were taken:
CK falling to CK2 rising: 629 psec
CK rising to CK2 falling: 668 psec
CK rising to CK falling: 2.99 nsec
CK2 rising to CK2 falling: 2.95 nsec.

The above measurements illustrate a 99% hightime (rising edge to falling edge) retention and a minimized delay (629–662 psec) delay between like edges of the global single-phase clock and the universal qualified clock buffer output signal.

The FET sizing listed below in TABLE D is tuned to generate a non-overlapping clock signal CK2N having a high time of 2.7 nanoseconds from a 167 MHz single-phase clock signal CK, and having a qualifier setup time of −200 psec with respect to the global single-phase clock signal CK. Table D specifies the FET sizing for each of the various FETS in the universal qualified clock buffer circuit of FIG. 10.

TABLE D

| FET | SIZE (width/length in microns) |
|---|---|
| 1006 | 2/1 |
| 1008 | 3.9/1 |
| 1010 | 7.4/1 |
| 1012 | 12.2/1 |
| 1014 | 2/1 |
| 1016 | 6/1 |
| 1018 | 4.8/1 |
| 1020 | 7.4/1 |
| 1022 | 48/1 |
| 1024 | 34/1 |
| 1026 | 1.4/1 |
| 1028 | 0.8/1 |
| 1030 | 150/1 |
| 1032 | 80/1 |
| 1034 | 8/1 |
| 1036 | 8/1 |
| 1038 | 14/1 |
| 1040 | 1.4/1 |

Using the above FET sizing, the deadtime (CK2 rising to CK2N rising) between CK2 of TABLE C and CK2N of TABLE D was measured at 171–315 psec.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A single-phase clocking scheme for allowing high-performance low-skew global data transfers in a VLSI chip, comprising:

a first level clock buffer for receiving an external global clock and producing a first level global clock substantially in phase with said external global clock;

a plurality of second level clock buffers, each corresponding to a different one of a plurality of localized logic blocks, each for synchronously receiving the first level global clock and for producing a respective second level global clock substantially in phase with said external global clock;

wherein each of said plurality of localized logic blocks comprises one or more third level clock buffers, each third level buffer is load matched to its localized logic block and each for synchronously receiving the second level global clock corresponding to its respective localized logic block, and said one or more third level clock buffers within the same localized logic block producing third level local clock signals including a different one of an overlapping clock signal, a complementary overlapping clock signal, a non-overlapping clock signal, and a substantially complementary non-overlapping clock signal to drive logic components contained within its respective localized logic block, and wherein at least one clock signal produced by said one or more third level clock buffers in one localized logic block has falling edges coincident to falling edges of at least one other clock signal that is produced by said one or more third level clock buffers from a different localized logic block to allow global signal transfers between different localized logic blocks on the VLSI chip to be timed to said third level local clock signals.

2. The single-phase clocking scheme of claim 1, wherein the global clock input is located at the center of the VLSI chip.

3. The single-phase clocking scheme of claim 2, further comprising equidistant symmetrically-arranged routing lines connecting the first level clock buffer and the respective second level clock buffers.

4. The single-phase clocking scheme of claim 1, further comprising equidistant symmetrically-arranged routing lines connecting each second level clock buffer and its respective third level clock buffers.

5. The single-phase clocking scheme of claim 1, wherein:

all like third level overlapping clock signals produced by said one or more third level clock buffers in any of said plurality of localized logic blocks have coincident falling edges, all like third level complementary overlapping clock signals produced by said one or more of third level clock buffers in any of said plurality of localized logic blocks have coincident falling edges, all like third level non-overlapping clock signals produced by said one or more of third level clock buffers in any of said plurality of localized logic blocks have coincident falling edges, and all like third level complementary non-overlapping clock signals produced by said one or more of third level clock buffers in any of said plurality of localized logic blocks have coincident falling edges.

6. The single-phase clocking scheme of claim 1, wherein falling edges of every overlapping clock signal produced by said one or more of third level clock buffers in any of said plurality of localized logic blocks and every non-overlapping clock signal produced by said one or more of third level clock buffers in any of said plurality of localized logic blocks are coincident, and the falling edges of every complementary overlapping clock signal produced by said one or more third level clock buffers in any of said plurality of localized logic blocks and every substantially complementary non-overlapping clock signal produced by said one or more of third level clock buffers in any of said plurality of localized logic blocks are coincident.

7. The single-phase clocking scheme of claim 6, wherein said every overlapping clock signal has rising edges coincident to the falling edges of said every complementary overlapping clock signal.

8. The single-phase clocking scheme of claim 1, wherein at least one third level clock buffer accepts a qualifier signal to generate a conditional pulse having a rising or falling edge with a desired phase delay from the corresponding rising or falling edge of the second level global clock.

9. The single-phase clocking scheme of claim 1, each third level clock buffer being capacitively matched to an impedance load of its corresponding localized logic block.

10. The single-phase clocking scheme of claim 1, each third level clock buffer implemented with an identically structured CMOSFET circuit, wherein differences in phase delay are generated using different FET sizes.

11. The single-phase clocking scheme of claim 10, wherein each third level clock buffer comprises:

a first NAND gate and a first NOR gate, each receiving the second level global clock at respective first NAND input and first NOR input thereof, the first NAND gate producing a pullup signal and the first NOR gate producing a pulldown signal;

a push-pull circuit for receiving the pullup signal and the pulldown signal and for producing an inverted third level local clock signal at an inverted output node;

a second NAND gate for receiving the inverted third level local clock signal and a first qualifier signal to produce a first feedback signal for input to the first NOR gate;

an output inverter for receiving the inverted third level local clock signal and for producing a third level local clock signal at an output node; and a feedback inverter coupled between the output node and the inverted output node for receiving, inverting, and feeding back the third level local clock signal to the inverted output node; and a feedback loop coupling said output node to a second NAND input of said first NAND gate for feeding back said third level local clock signal as input to said first NAND gate.

12. The single-phase clocking scheme of claim 11, wherein the push-pull circuit of each third level clock buffer comprises a push PFET and a pull NFET, the push PFET having a source coupled to a power supply, a drain coupled to the inverted third level local clock, and a gate coupled to receive the pullup signal;

the pull NFET having a source coupled to both the inverted third level local clock and the drain of the push PFET, a drain coupled to a chip ground, and a gate coupled to receive the pulldown signal.

13. A single-phase clocking scheme for allowing high-performance low-skew global data transfers in a VLSI chip having a plurality of localized logic blocks implemented thereon, each localized logic block comprising a plurality of localized logic components, comprising:

a first level clock buffer located at the center of the VLSI chip for receiving an external global clock and producing a first level global clock;

a plurality of second level clock buffers, one corresponding to each localized logic block, each receiving the first level global clock and each producing a respective second level global clock;

a plurality of equidistant symmetrically-arranged first level routing lines connecting the first level clock buffer and the second level clock buffers;

a plurality of third level clock buffers located inside each of the localized logic blocks, each receiving the second level global clock of its respective localized logic block via a plurality of equidistant symmetrically-arranged second level routing lines connecting the respective second level clock buffer and its corresponding third level clock buffers, and each third level clock buffer within the same localized logic block producing a different third level local clock to drive the respective localized logic components of its respective localized logic block; wherein each third level clock buffer generates one of an overlapping clock signal, a complementary overlapping clock signal, a non-overlapping clock signal, or a substantially complementary non-overlapping clock signal, wherein each overlapping clock signal generated by any of said plurality of third level clock buffers in any of said plurality of localized logic blocks and each non-overlapping signal generated by any of said plurality of said third level clock buffers in any of said plurality of localized logic blocks have coincident falling edges, and each complementary overlapping clock signal generated by any of said plurality of third level clock buffers in any of said plurality of localized logic blocks and substantially complementary non-overlapping clock signal generated by any of said plurality of third level clock buffers in any of said plurality of localized logic blocks have coincident falling edges.

14. A method for using a single-phase clock to perform high-speed low-skew global data transfers in a VLSI chip having a plurality of localized logic blocks implemented thereon, each localized logic block comprising a plurality of localized logic components, the method comprising the steps of:

(a) receiving an external global clock at a first level clock buffer;

(b) producing a first level global clock via the first level clock buffer substantially in phase with said external global clock;

(c) synchronously distributing the first level global clock to a plurality of second level clock buffers, one corresponding to each localized logic block;

(d) producing a plurality of second level global clocks substantially in phase with said external global clock via each second level clock buffer;

(e) synchronously distributing each second level global clock to a plurality of third level clock buffers located inside each respective localized logic block, each of said third level clock buffers being load matched to its localized logic block, and said plurality of third level clock buffers located within any given localized logic block generating third level local clock signals including a different one of an overlapping clock signal, a complementary overlapping clock signal, a non-overlapping clock signal, or a substantially complementary non-overlapping clock signal; and (f) ensuring that at least one clock signal produced by a third level clock buffer in one localized logic block has falling edges coincident to falling edges of at least one other clock signal that is produced by a third level clock buffer from a different localized logic block to allow global signal transfers between different localized logic blocks on the VLSI chip to be timed to third level local clock signals.

15. The method of claim 14, wherein:

all like third level overlapping clock signals produced by any of said plurality of third level clock buffers in any of said plurality of localized logic blocks have coincident falling edges, all like third level complementary overlapping clock signals produced by any of said plurality of third level clock buffers in any of said plurality of localized logic blocks have coincident falling edges, all like third level non-overlapping clock signals produced by any of said plurality of third level clock buffers in any of said plurality of localized logic blocks have coincident falling edges, all like third level complementary non-overlapping clock signals produced by any of said plurality of third level clock buffers in any of said plurality of localized logic blocks have coincident falling edges.

16. The method of claim 15, wherein each overlapping clock signal produced by any of said plurality of third level clock buffers in any of said plurality of localized logic blocks and each non-overlapping clock signal produced by any of said plurality of third level clock buffers in any of said plurality of localized logic blocks have coincident falling edges, and each complementary overlapping clock signal produced by any of said plurality of third level clock buffers in any of said plurality of localized logic blocks and each complementary non-overlapping clock signal by any of said plurality of third level clock buffers in any of said plurality of localized logic blocks produced have coincident falling edges.

17. The method of claim 16, wherein each overlapping clock signal produced has rising edges coincident to falling edges of each complementary overlapping clock signal produced.

* * * * *

UNITED STATES PATENT AND TRADEMARK OFFICE
CERTIFICATE OF CORRECTION

PATENT NO.   : 5,726,596
DATED        : March 10, 1998
INVENTOR(S)  : Paul L. Perez It is certified that error appears in the above-identified patent and that said Letters Patent is hereby corrected as shown below:

| | |
|---|---|
| Column 13, Line 57: | After "more" delete "of" (USPTO's error) |
| Column 13, Line 61: | After "more" delete "of" (USPTO's error) |
| Column 13, Line 65: | After "more" delete "of" (USPTO's error) |
| Column 14, Line 3: | After "more" delete "of" (USPTO's error) |
| Column 14, Line 5: | After "more" delete "of" (USPTO's error) |
| Column 14, Line 12: | After "more" delete "of" (USPTO's error) |

Signed and Sealed this

Fifteenth Day of May, 2001

Attest:

NICHOLAS P. GODICI

*Attesting Officer*   *Acting Director of the United States Patent and Trademark Office*